(12) United States Patent
Forsyth

(10) Patent No.: US 7,225,929 B2
(45) Date of Patent: Jun. 5, 2007

(54) ADJUSTABLE HEIGHT WAFER BOX

(75) Inventor: Valoris L. Forsyth, Lewisville, TX (US)

(73) Assignee: Illinois Tool Works Inc., Glenview, IL (US)

( * ) Notice: Subject to any disclaimer, the term of this patent is extended or adjusted under 35 U.S.C. 154(b) by 185 days.

(21) Appl. No.: 11/026,101

(22) Filed: Dec. 30, 2004

(65) Prior Publication Data

US 2006/0144752 A1    Jul. 6, 2006

(51) Int. Cl.
*B65D 85/48* (2006.01)
(52) U.S. Cl. .................... 206/710; 220/4.28
(58) Field of Classification Search ............ 206/454, 206/710, 831; 220/4.01, 4.28; 229/101, 229/101.1, 101.2
See application file for complete search history.

(56) References Cited

U.S. PATENT DOCUMENTS

| | | | | |
|---|---|---|---|---|
| 1,076,156 A | * | 10/1913 | Schierse | 229/101 |
| 2,004,501 A | * | 6/1935 | Curtis, Jr. | 229/101 |
| 2,969,902 A | * | 1/1961 | Cage | 229/101.1 |
| 4,091,929 A | * | 5/1978 | Krane | 229/101.1 |
| 4,762,233 A | * | 8/1988 | Sears et al. | 229/101.2 |
| 5,373,956 A | * | 12/1994 | Kaufer et al. | 220/4.28 |
| 5,840,377 A | * | 11/1998 | Donnell | 220/4.28 |
| 7,021,625 B2 | * | 4/2006 | Simmons | 273/157 R |

* cited by examiner

*Primary Examiner*—Luan K. Bui
(74) *Attorney, Agent, or Firm*—Day Pitney LLP

(57) ABSTRACT

An adjustable height wafer box for the transportation of coin-stacked semiconductor wafers is disclosed. The adjustable height wafer box comprises a base plate, a cover plate, a plurality of ring insert plates and elastomer bumpers. The ring insert plates are stacked so as to successively engage one another, as well as engaging the base plate and the cover plate. The elastomer bumpers are engaged between successive ring insert plates and extend inwardly into the wafer containment space. The number of ring insert plates can be chosen to adjust the height of the wafer box in accordance with the number of coin-stacked semiconductor wafers to be shipped.

15 Claims, 3 Drawing Sheets

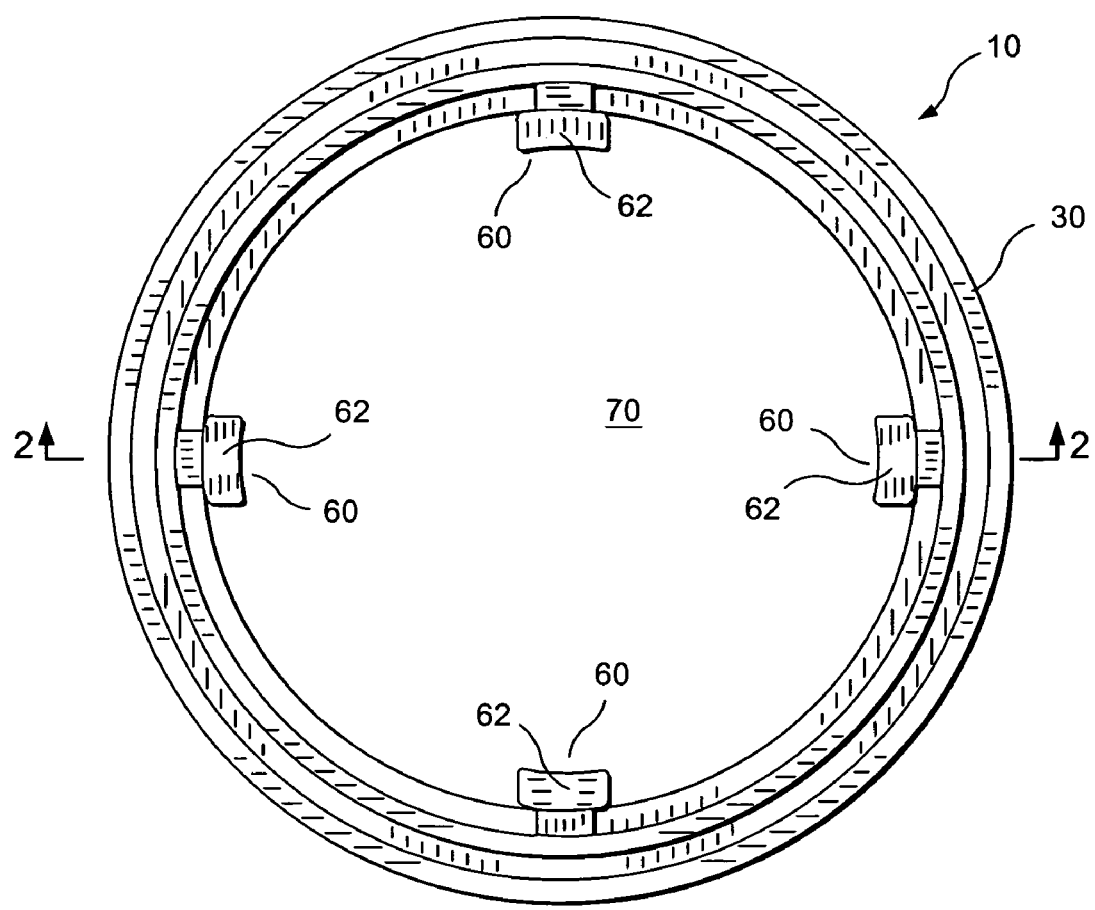
F I G. 1

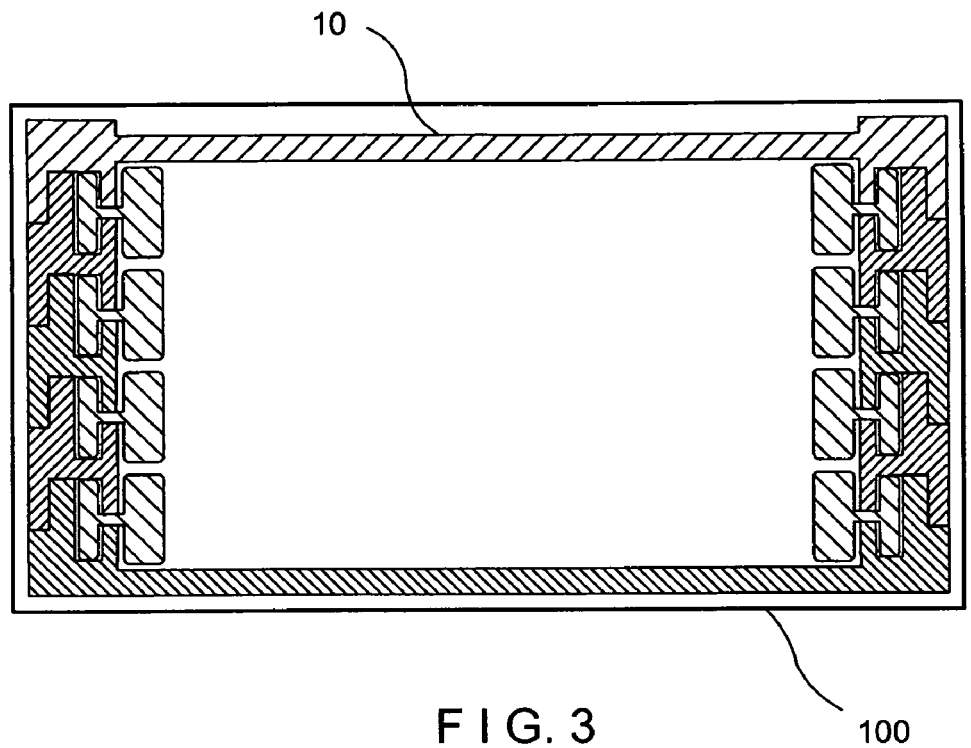
F I G. 3
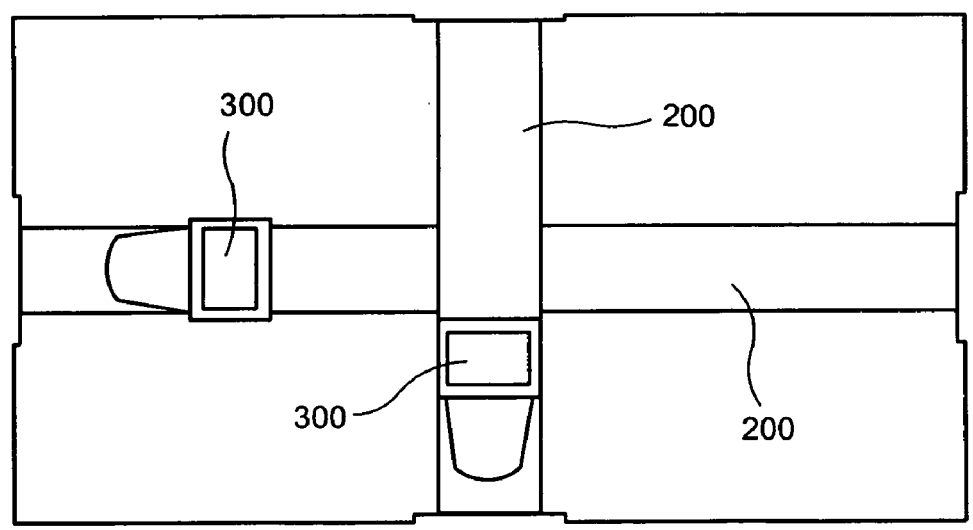
F I G. 4

ADJUSTABLE HEIGHT WAFER BOX

BACKGROUND OF THE INVENTION

1. Field of the Invention

This invention pertains to a box for the transportation of semiconductor wafers. In particular, this invention pertains to such a box with walls that are adjustable in height so as to accommodate the number of coin-stacked wafers to be transported.

2. Description of the Prior Art

In the prior art, there are many boxes for the transportation of coin-stacked semiconductor wafers. However, typical prior art wafer boxes have a fixed size for a fixed number of semiconductor wafers. As a result, the volume of shipping containers and dunnage material is the same regardless of the number of wafers enclosed within the wafer box. This can increase the shipping costs associated with a "partial run" which is typically defined as less than twenty-four wafers.

Examples of some prior art are U.S. Pat. No. 6,193,068 entitled "Containment Device for Retaining Semiconductor Wafers" issued on Feb. 27, 2001 to Lewis et al.; U.S. Pat. No. 6,286,684 entitled "Protective System for Integrated Circuit (IC) Wafers Retained Within Containers Designed for Storage and Shipment" issued on Sep. 11, 2001 to Brooks et al.; U.S. Pat. No. 6,003,674 entitled "Method and Apparatus for Packing Contaminant-Sensitive Articles and Resulting Package" issued on Dec. 21, 1999 to Brooks; and U.S. Pat. No. 5,724,748 entitled "Apparatus for Packaging Contaminant-Sensitive Articles and Resulting Package" issued on Mar. 10, 1998 to Brooks et al. Also of interest is U.S. patent application Ser. No. 10/507,471 entitled "Wafer Box with Radially Pivoting Latch Elements" filed on Sep. 10, 2004 by Forsyth.

OBJECTS AND SUMMARY OF THE INVENTION

It is therefore an object of the present invention to provide a box for semiconductor wafers which is adjustable in size in order to reduce the volumetric space required for shipping partial lots of semiconductor wafers.

This and other objects are achieved by providing a wafer box with a base plate, a plurality of ring insert plates, and a cover plate. The wall height is varied by varying the number of ring insert plates stacked and assembled between the base plate and the cover plate. The ring insert plates are generally ring-shaped and include an upper circular ridge and a lower circular groove. The upper circular ridge of a ring insert plate is received by the lower circular groove of an upwardly successive ring insert plate. The upper circular ridge of the uppermost ring insert plate is received by a lower circular groove in the cover plate. Likewise, the base plate includes a ridge which is received by the groove in the lowermost ring insert plate. The ring insert plates further include notches to receive elastomer bumpers to act as cushions to the wafers inserted into the assembled box.

The inner diameter of the ring insert plates is chosen to accommodate the desired size of the semiconductor wafers, with allowance for the elastomer bumpers.

BRIEF DESCRIPTION OF THE DRAWINGS

Further objects and advantages of the invention will become apparent from the following description and claims and from the accompanying drawings, wherein:

FIG. 1 is a top plan view of the adjustable height wafer box of the present invention, shown with the cover plate removed.

FIG. 3 is a plan view, partially in phantom, showing the adjustable height wafer box of the present invention inside of a shipping container.

FIG. 4 is a plan view of the shipping container which includes the adjustable height wafer box of the present invention, the shipping container being secured by straps with a Velcro buckle.

DETAILED DESCRIPTION OF THE PREFERRED EMBODIMENT

Figure 2:
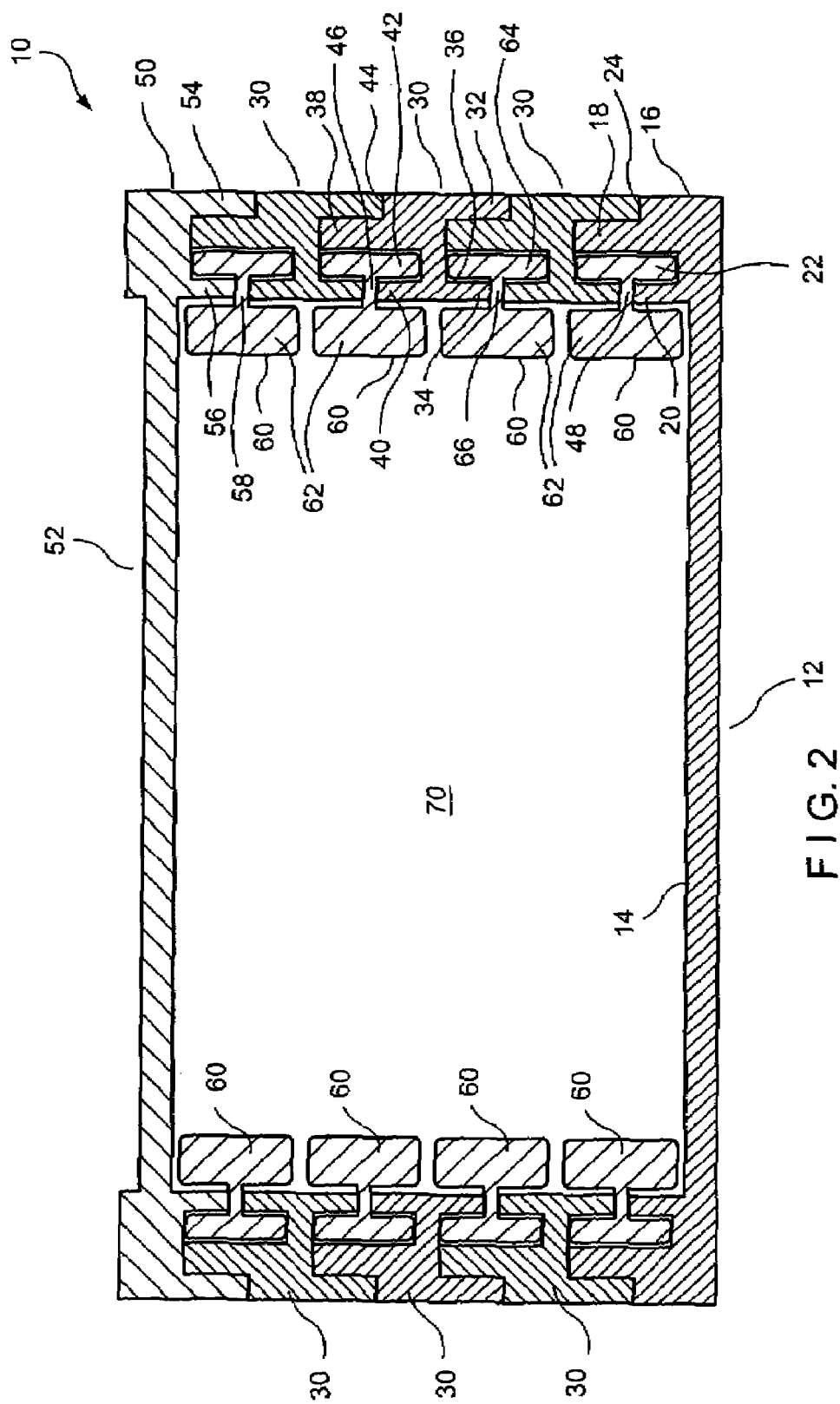
FIG. 2 is a cross-sectional view along plane 2—2 of FIG. 1, shown with the cover plate in place.

Referring now to the drawings in detail, wherein like numerals refer to like elements throughout the several views, one sees that FIG. 1 is a top plan view of the adjustable height wafer box 10 of the present invention (with the cover plate removed) and that FIG. 2 is a cross-sectional view of the adjustable height wafer box 10 of the present invention. Adjustable height wafer box 10 includes base plate 12, ring insert plates 30, cover plate 50 and elastomer bumpers 60. Wafer containment space 70 is formed within adjustable height wafer box 10. A typical material for the base plate 12, ring insert plates 30 and cover plate 50 is polyethylene plastic and a typical material for elastomer bumpers 60 is extruded soft or semi-soft plastic, but those skilled in the art will recognize a range of equivalents after review of this disclosure.

Base plate 12 comprises planar floor 14, outer cylindrical wall 16, upper circular ridge 18 recessed from outer cylindrical wall 16, and inner circular ridge 20 extending upwardly from planar floor 14 and inwardly adjacent from upper circular ridge 18. Gap 22 is formed between upper circular ridge 18 and inner circular ridge 20. Ledge 24 is formed in the transition from outer cylindrical wall 16 to upper circular ridge 18.

Ring insert plates 30 are generally ring-like in shape with a cross section with a lower outer leg 32 and a lower inner leg 34. The periphery of lower outer leg 32 aligns with outer cylindrical wall 16 of base plate 12 and lower inner leg 34 aligns with inner circular ridge 20 of base plate 12. The space between lower outer leg 32 and lower inner leg 34 forms lower circular groove 36. The cross section of ring insert plates 30 further includes upper outer leg 38 and upper inner leg 40. The diameter of upper outer leg 38 is substantially the same as that of upper circular ridge 18 of base plate 12 whereas the diameter of upper inner leg 40 is substantially the same as inner circular ridge 20 of base plate 20. Gap 42 is formed between upper outer leg 38 and upper inner leg 40. Ledge 44 is formed at the transition from lower outer leg 32 to upper outer leg 38. The profile of ledge 44, upper outer leg 38, gap 42 and inner upper leg 40 is substantially the same as the profile of ledge 24, upper circular ridge 18, gap 22 and inner circular ridge 20 of base plate 12. This allows lower outer leg 32 and lower inner leg 34 to engage either base plate 12 or a successively lower ring insert plate 30.

Vertical gap 46 is formed between lower inner leg 34 of a given ring insert plate 30 and upper inner leg 40 of a successively lower ring insert plate 30. A substantially identical vertical gap 48 is formed between the lower inner leg 34 of the lowest ring insert plate 30 and inner circular ridge 20 of base plate 12.

Cover plate 50 comprises planar top 52, outer circular ridge 54 about a periphery of planar top 52 and inner circular ridge 56 inwardly adjacent to outer circular ridge 54. Outer circular ridge 54 and inner circular ridge 52 align with lower outer leg 32 and lower inner leg 34, respectively, so as to present a lower profile which is substantially equal thereto. This allows cover plate 50 to engage the uppermost ring insert plate 30. Vertical gap 58, substantially identical to vertical gaps 46, 48, is formed between inner circular ridge 56 and the upper inner leg 40 of the highest ring insert plate 30.

Elastomer bumpers 60 include inner bumper pad 62 joined to outer support element 64 by cross-support element 66 to form an H-type configuration. Elastomer bumpers 60 are installed so that cross-support elements 66 pass through vertical gaps 46, 48, 58, and inner bumper pads 62 are inwardly adjacent from lower inner leg 34 and upper inner leg 40 thereby extending into and defining wafer containment space 70. Outer support element 64 is engaged within the space bounded outwardly by upper outer leg 38 and bounded inwardly by upper inner leg 40 of a given ring insert plate 30 and the lower inner leg 34 of a successively upward ring insert plate 30. Similarly, the outer support element 64 of the lowest elastomer bumper 60 is engaged within the space bounded outwardly by upper circular ridge 18 and bounded inwardly by inner circular ridge 20 of base plate 12 and the lower inner leg 34 of the lowest ring insert plate 30. The outer support element 64 of the highest elastomer bumper 60 is engaged within the space bounded outwardly by upper outer leg 38 of the highest ring insert plate 30 and bounded inwardly by upper inner leg 40 of the highest ring insert plate 30 and the inner circular ridge 56 of cover plate 50.

To use adjustable height wafer box 10, the user starts with base plate 12 and installs the lowest elastomer bumpers 60. The user then alternates installing a ring insert plate 30 and elastomer bumpers 60 (typically at least four elastomer bumpers would be required around the periphery of wafer containment space 70 between each successive ring insert plate 30). The user chooses the appropriate number of ring insert plates 30 to construct a wafer box 10 with the appropriate height for the number of semiconductor wafers (not shown) to be shipped. The user would then insert the semiconductor wafers and place the cover plate 50 over the highest ring insert plate 30 to complete the wafer box 10. The user would then use any number of methods to secure the wafer box 10 from disassembly. One way to secure the wafer box 10 from disassembly would be to place the completed and filled wafer box 10 into a shipping container 100 and secure the shipping container with straps 200 with Velcro or similar buckles 300 as shown in FIGS. 3 and 4.

Alternately, for the shipment of a small number of semiconductor wafers, the ring insert plates 30 can be omitted, with the base plate 12 attached to the cover plate 50 with the elastomeric bumpers 60 and a small number of semiconductor wafers therebetween.

Thus the several aforementioned objects and advantages are most effectively attained. Although a single preferred embodiment of the invention has been disclosed and described in detail herein, it should be understood that this invention is in no sense limited thereby and its scope is to be determined by that of the appended claims.

What is claimed is:

1. An adjustable height box for containing semiconductor wafers, comprising:

a base plate defining a bottom of the box;

a cover plate defining a top of the box;

a plurality of engaging ring elements engaged between said base plate and said cover plate thereby defining a wall of the box, whereby a height of the box can be varied by varying a number of said plurality of engaging ring elements, wherein an interior of said ring elements define a wafer containment space; and bumper elements extending from said ring elements into said wafer containment area for cushioning semiconductor wafers.

2. The adjustable height box of claim 1 wherein said bumper elements are engaged between successive ring elements.

3. The adjustable height box of claim 2 wherein a portion of said bumper elements are engaged between said cover plate and a ring element adjacent thereto.

4. The adjustable height box of claim 3 wherein a portion of said bumper elements are engaged between said base plate and a ring element adjacent thereto.

5. The adjustable height box of claim 1 wherein said ring elements include a circular groove and a circular ridge, wherein said circular groove engages said circular ridge of an adjacent ring element.

6. The adjustable height box of claim 5 wherein said circular groove is formed as a space between an inner extending leg and an outer extending leg.

7. The adjustable height box of claim 6 wherein said space between said inner and outer extending legs receives said circular ridge of an adjacent ring element.

8. The adjustable height box of claim 7 wherein a gap is formed between said inner extending leg and a successive ring element.

9. The adjustable height box of claim 8 wherein said bumper element has an H cross section formed from an inner bumper pad and an outer support element joined by a cross support element.

10. The adjustable height box of claim 9 wherein said cross support element extends through said gap between said inner extending leg and a successive ring element, said outer support element is received in said space between said two extending legs, and said inner bumper pad extends into said wafer containment space.

11. The adjustable height box of claim 10 wherein said cover plate includes a profile inwardly adjacent from a periphery thereof which engages an upper portion of one of said ring elements.

12. The adjustable height box of claim 11 wherein said base plate includes a profile inwardly adjacent from a periphery thereof which engages a lower portion of one of said ring elements.

13. The adjustable height box of claim 12 wherein said inner extending leg and said outer extending leg are on a bottom of said ring element, and wherein said circular ridge is on a top of said ring element.

14. The adjustable height box of claim 13 further including an inner upwardly extending leg inwardly adjacent from said circular ridge.

15. The adjustable height box of claim 14 wherein said inner upwardly extending leg on said top of said ring element aligns with said inner extending leg on said bottom of said ring element.

* * * * *